(12) United States Patent
Saito et al.

(10) Patent No.: US 8,981,436 B2
(45) Date of Patent: Mar. 17, 2015

(54) STACKED STRUCTURE, SPIN TRANSISTOR, AND RECONFIGURABLE LOGIC CIRCUIT

(71) Applicant: Kabushiki Kaisha Toshiba, Minato-ku (JP)

(72) Inventors: Yoshiaki Saito, Kawasaki (JP); Tomoaki Inokuchi, Yokohama (JP); Mizue Ishikawa, Yokohama (JP); Hideyuki Sugiyama, Kawasaki (JP); Tetsufumi Tanamoto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/041,055

(22) Filed: Sep. 30, 2013

(65) Prior Publication Data
US 2014/0117427 A1    May 1, 2014

(30) Foreign Application Priority Data
Oct. 29, 2012 (JP) .................. 2012-237600

(51) Int. Cl.
| | | |
|---|---|---|
| H01L 21/02 | (2006.01) | |
| H01L 27/108 | (2006.01) | |
| H01L 29/94 | (2006.01) | |
| H01L 29/82 | (2006.01) | |
| H01L 21/00 | (2006.01) | |
| H01L 43/10 | (2006.01) | |
| H01L 29/66 | (2006.01) | |
| H03K 19/173 | (2006.01) | |

(Continued)

(52) U.S. Cl.
CPC .......... *H01L 43/10* (2013.01); *H01L 29/66984* (2013.01); *H03K 19/1733* (2013.01); *H03K 19/18* (2013.01); *H03K 19/17728* (2013.01)

USPC .................. 257/288; 257/421; 438/3

(58) Field of Classification Search
USPC .......... 257/414–470, 295, 296, 532, 659, 39, 257/289, 401, E43.001, E43.004, E27.005, 257/E27.008, E29.167, E29.323, E21.665, 257/E29.165, E29.273, E21.209, E21.437, 257/E21.664, E27.014; 438/3
See application file for complete search history.

(56) References Cited

U.S. PATENT DOCUMENTS

| | | | |
|---|---|---|---|
| 6,256,223 B1 * | 7/2001 | Sun ............................. | 365/171 |
| 6,515,341 B2 * | 2/2003 | Engel et al. ................... | 257/421 |

(Continued)

FOREIGN PATENT DOCUMENTS

| | | |
|---|---|---|
| JP | 2008-66596 | 3/2008 |
| JP | 2009-54724 | 3/2009 |

OTHER PUBLICATIONS

Satoshi Sugahara et al. "A spin metal-oxide-semiconductor field-effect transistor using half-metallic-ferromagnet contacts for the source and drain", Applied Physics Letters, vol. 84., No. 13., Mar. 29, 2004, 4 pages.

(Continued)

*Primary Examiner* — Evan Pert
*Assistant Examiner* — Gustavo Ramallo
(74) *Attorney, Agent, or Firm* — Oblon, McClelland, Maier & Neustadt, L.L.P.

(57) ABSTRACT

A stacked structure according to an embodiment includes: a semiconductor layer; a first layer formed on the semiconductor layer, the first layer containing at least one element selected from Zr, Ti, and Hf, the first layer being not thinner than a monoatomic layer and not thicker than a pentatomic layer; a tunnel barrier layer formed on the first layer; and a magnetic layer formed on the tunnel barrier layer.

16 Claims, 14 Drawing Sheets

(51) Int. Cl.
*H03K 19/18* (2006.01)
*H03K 19/177* (2006.01)

(56) References Cited

U.S. PATENT DOCUMENTS

| | | | | |
|---|---|---|---|---|
| 6,784,510 | B1* | 8/2004 | Grynkewich et al. | 257/421 |
| 6,798,004 | B1* | 9/2004 | Grynkewich et al. | 257/295 |
| 7,351,483 | B2* | 4/2008 | Parkin | 428/811.1 |
| 7,602,636 | B2* | 10/2009 | Saito et al. | 365/158 |
| 7,629,182 | B2* | 12/2009 | Wise | 438/3 |
| 7,709,867 | B2* | 5/2010 | Ishikawa et al. | 257/289 |
| 7,943,974 | B2* | 5/2011 | Ishikawa et al. | 257/289 |
| 8,008,097 | B2* | 8/2011 | Parkin | 438/3 |
| 8,026,561 | B2* | 9/2011 | Saito et al. | 257/421 |
| 8,236,578 | B2* | 8/2012 | Mather et al. | 438/3 |
| 8,243,400 | B2* | 8/2012 | Ishikawa et al. | 360/324.2 |
| 8,357,962 | B2* | 1/2013 | Marukame et al. | 257/295 |
| 8,487,359 | B2* | 7/2013 | Saito et al. | 257/296 |
| 2009/0057654 | A1* | 3/2009 | Saito et al. | 257/39 |
| 2010/0019798 | A1* | 1/2010 | Saito et al. | 326/49 |
| 2014/0197504 | A1* | 7/2014 | Moriyama et al. | 257/421 |

OTHER PUBLICATIONS

Yoshiaki Saito et al. "Spin Injection, transport, and read/write operation in spin-based MOSFET", Thin Solid Films 519 (2011), pp. 8266-8273.

* cited by examiner

US 8,981,436 B2

STACKED STRUCTURE, SPIN TRANSISTOR, AND RECONFIGURABLE LOGIC CIRCUIT

CROSS REFERENCE TO RELATED APPLICATIONS

This application is based upon and claims the benefit of priority from prior Japanese Patent Application No. 2012-237600 filed on Oct. 29, 2012 in Japan, the entire contents of which are incorporated herein by reference.

FIELD

Embodiments described herein relate generally to stacked structures, spin transistors, and reconfigurable logic circuits.

BACKGROUND

In recent years, active studies have been made to develop devices having novel functions, such as a field effect transistor (MOSFET) in which ferromagnetic layers or stacked structures formed with ferromagnetic layers and tunnel barrier layers (ferromagnetic layer/tunnel barrier layer) are provided as ferromagnetic electrodes on the source region and the drain region (hereinafter also referred to as the source/drain regions). One of those devices is a spin MOSFET in which the source/drain regions contain a magnetic material. Such a spin MOSFET is characterized in that the output characteristics can be controlled simply by switching the spin moment direction of the magnetic material in the source/drain regions. With such spin MOSFETs, it is possible to form a spin MOSFET structure or a reconfigurable logic circuit that has a reconfigurable function and an amplifying function.

As a method of writing to switch spins, a method of writing using a spin transfer torque technique has been suggested. Spin switching caused in a magnetic material by flowing spin-polarized current into the magnetic material have been observed. To use spin transfer torque writing in spin MOSFETs, there has been a suggested structure in which a MTJ (Magnetic Tunnel Junction) is provided on at least one of the source and the drain.

As a method of orienting a tunnel barrier layer, formation of an amorphous underlayer between a semiconductor layer and the tunnel barrier layer has been suggested. However, the use of an amorphous underlayer reduces the effect to achieve a low interfacial resistance.

DETAILED DESCRIPTION

A stacked structure according to an embodiment includes: a semiconductor layer; a first layer formed on the semiconductor layer, the first layer containing at least one element selected from Zr, Ti, and Hf, the first layer being not thinner than a monoatomic layer and not thicker than a pentatomic layer; a tunnel barrier layer formed on the first layer; and a magnetic layer formed on the tunnel barrier layer.

The following is a detailed description of embodiments, with reference to the accompanying drawings. However, the drawings are merely schematic, and the sizes of the respective components and the size ratio between components differ from those in practice. Also, the same components might differ in size or ratio between the drawings.

First Embodiment

Figure 1:
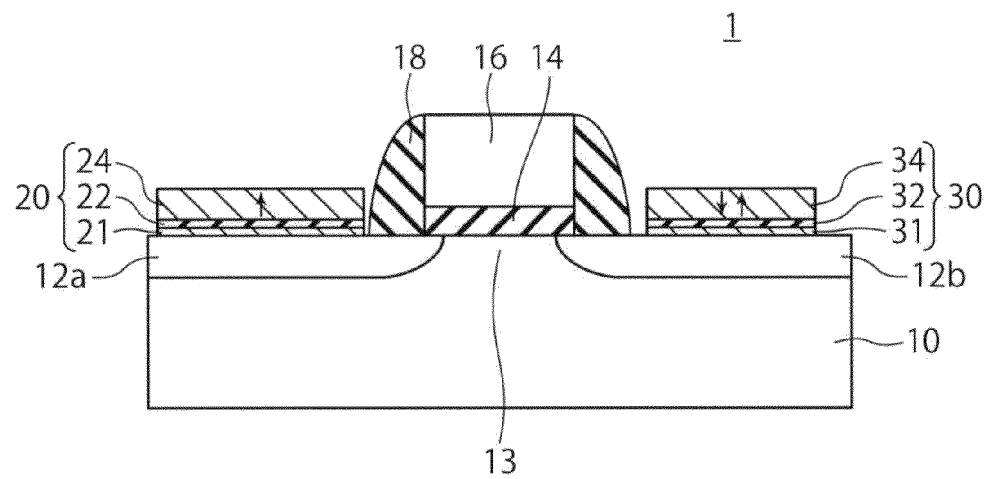
FIG. 1 is a cross-sectional view of a spin transistor according to a first embodiment.

FIG. 1 shows a spin transistor according to a first embodiment. A spin transistor 1 of the first embodiment includes: source/drain regions 12a and 12b that are provided at a distance from each other on a semiconductor layer 10; a gate insulating film 14 that is provided on a portion of a region 13 of the semiconductor layer 10, the portion being to be the channel region between the source region and the drain region; a gate electrode 16 provided on the gate insulating film 14; and gate sidewalls 18 that are made of an insulating material and are provided at the side portions of the gate electrode 16. A stacked structure 20 including a magnetic material is provided on the region 12a, which is one of the source/drain regions 12a and 12b, and a stacked structure 30 including a magnetic material is provided on the other region 12b.

The semiconductor layer 10 may be a semiconductor substrate, an SOI (Silicon on Insulator) layer, a GOI (Germanium on Insulator) layer, or a well region. Alternatively, the semiconductor layer 10 may be made of a III-V group compound semiconductor.

In the following description, the region 12a will be described as the source region, and the region 12b will be described as the drain region. However, the region 12a may be the drain region, and the region 12b may be the source region. Meanwhile, the semiconductor layer 10 will be described as a p-type semiconductor layer, and the source region 12a and the drain region 12b will be described as n-type impurity regions containing an n-type impurity in the following description. However, the semiconductor layer 10 may be an n-type semiconductor layer, and the source region 12a and the drain region 12b may be p-type impurity regions containing a p-type impurity. In the former case, an n-p-n junction is formed in the semiconductor layer 10, so that the spin transistor turns into an n-channel spin MOSFET. In the latter case, a p-n-p junction is formed in the semiconductor layer 10, so that the spin transistor turns into a p-channel spin MOSFET.

An impurity is preferably introduced at a high density into the surfaces of the source/drain regions 12a and 12b. More preferably, $n^+$-layers are formed on the surfaces of the n-type impurity regions 12a and 12b, for example. Those $n^+$-layers can be formed by adding an impurity by an ion implantation method and then performing annealing by RTA (Rapid Thermal Annealing) as in the conventional MOS transistor formation. In this case, the same effects can be achieved by forming $n^+$-layers that are δ-doped at locations several nm deep from the substrate surface in the film thickness direction.

Specifically, in an n-channel MOSFET or a p-channel MOSFET using a Si or Ge semiconductor layer, B (boron) is preferably used as the p-type impurity, and P (phosphorus) or As (arsenic) is preferably used as the n-type impurity.

In a case where the semiconductor layer 10 is an InGaAs layer, it is preferable to use an n-channel MOSFET, since the mobility of an n-channel MOSFET is normally higher than the mobility of a p-channel MOSFET. In the case of an n-channel MOSFET, doping is normally performed with Si or Ge. The acceleration of ions of the element to be implanted into $n^+$-layers or $p^+$-layers is preferably reduced to a low acceleration of 20 KeV or less, and high-density ion implantation is preferably performed. When the impurity is Si, the impurity element can be the same between the $n^+$-layers and the n-type impurity layers 12a and 12b without problem. When the impurity is Ge, however, P or As is preferably used as the impurity in the n-type impurity layer, and S (sulfur) is preferably used as the impurity in the $n^+$-layers, so that the resistance becomes slightly lower, and a high-speed device is obtained. After Ge ion implantation, RTA is performed in $N^2$. When the semiconductor layer 10 is made of Si, RTA is performed at 1000° C. to 1100° C. When the semiconductor layer 10 is made of Ge, RTA is performed at 400° C. to 500° C. When the semiconductor layer 10 is made of GaAs, RTA is performed at 300° C. to 600° C. in As, or doping is performed with Si and growth is performed at the time of film formation. In any case, a preferable MOSFET can be realized, and spin dependence transmission is observed.

The stacked structure 20 includes a Zr-containing layer 21 formed on the source region 12a, a tunnel barrier layer 22 formed on the Zr-containing layer 21, and a magnetic layer 24 formed on the tunnel barrier layer 22. The stacked structure 30 includes a Zr-containing layer 31 formed on the drain region 12b, a tunnel barrier layer 32 formed on the Zr-containing layer 31, and a magnetic layer 34 formed on the tunnel barrier layer 32. The Zr-containing layers 21 and 31 may be replaced with Ti-containing layers, respectively. The Zr-containing layers 21 and 31 are preferably pentatomic Zr layers as will be described later, and the Ti-containing layers are preferably pentatomic Ti layers. In a case where the semiconductor layer 10 is a Si layer, the Zr-containing layers 21 and 31 may be Si—Zr mixed layers, and the Ti-containing layers may be Si—Ti mixed layers. Instead of Zr or Ti, Hf may be used. The layers 21 and 31 may include at least two elements selected from Zr, Ti, and Hf. Those stacked structures 20 and 30 each having a low junctional resistance will be described in detail in the later described Examples.

In the first embodiment, the area of the film plane of the stacked structure 20 on the source region 12a and the area of the film plane of the stacked structure 30 on the drain region 12b preferably differ from each other. Here, a film plane means a cross-section of a stacked structure taken along a plane perpendicular to the stacking direction, and the area of the film plane means the area of the cross-section. In this case, the stacked structure having the smaller area contributes to spin transfer torque switching. The ratio between those areas is preferably 1.1 or higher, or more preferably, 1.2 or higher. In FIG. 1, the film plane of the stacked structure 20 formed on the source region 12a has the larger area. However, the film plane of the stacked structure 30 formed on the drain region 12b may have the larger area.

(Write Method)

A write method used in the spin transistor of the first embodiment having the above described structure is now described. The magnetic layer 24 of the stacked structure 20 and the magnetic layer 34 of the stacked structure 30 will be described below as layers each having a magnetization direction perpendicular to the film plane as shown in FIG. 1, but each of those magnetic layers may have a magnetization direction parallel to the film plane.

Writing to be performed to switch the magnetization direction of the magnetic layer 34 to an upward direction in a case where the magnetization direction of the magnetic layer 24 of the stacked structure 20 is the upward direction as shown in FIG. 1 while the magnetization direction of the magnetic layer 34 of the stacked structure 30 is a downward direction is described. In the case of this writing, voltage is first applied to the gate electrode 16, to put the spin transistor 1 into an ON state. In this state, electrons for writing are made to flow from the magnetic layer 24 of the stacked structure 20 to the tunnel barrier layer 22, the Zr-containing layer 21, the source region 12a, the channel region 13, the drain region 12b, the Zr-containing layer 31, the tunnel barrier layer 32, and the magnetic layer 34. As a result, the electrons that have passed through the magnetic layer 24 are spin-polarized, and the spin-polarized electrons flow into the magnetic layer 34 through the tunnel barrier layer 22, the Zr-containing layer 21, the source region 12a, the channel region 13, the drain region 12b, the Zr-containing layer 31, and the tunnel barrier layer 32. The spin-polarized electrons that flow into the magnetic layer 34 apply spin torque to the magnetization of the magnetic layer 34, to switch the magnetization direction of the magnetic layer 34 to the same direction as the magnetization of the magnetic layer 24.

Next, writing to be performed to switch the magnetization direction of the magnetic layer 34 to the downward direction in a case where the magnetization direction of the magnetic layer 34 of the stacked structure 30 is the upward direction is described. In the case of this writing, voltage is first applied to the gate electrode 16, to put the spin transistor 1 into an ON state. In this state, electrons are made to flow from the magnetic layer 34 to drain region 12b, the channel region 13, the source region 12a, and the stacked structure 20. As a result, the electrons that have passed through the magnetic layer 34 are spin-polarized, and the spin-polarized electrons flow into the magnetic layer 24 through the tunnel barrier layer 32, the Zr-containing layer 31, the drain region 12b, the channel region 13, the source region 12a, the Zr-containing layer 21, and the tunnel barrier layer 22. Of the spin-polarized electrons, the electrons having spins in the same direction as the magnetization of the magnetic layer 24 pass through the magnetic layer 24. However, of the spin-polarized electrons, the electrons having spins in the opposite direction from the magnetization of the magnetic layer 24 are reflected by the interface between the tunnel barrier layer 22 and the magnetic layer 24. The reflected electrons flow into the magnetic layer 34 through the tunnel barrier layer 22, the Zr-containing layer 21, the source region 12a, the channel region 13, the drain region 12b, the Zr-containing layer 31, and the tunnel barrier layer 32. The spin-polarized electrons that flow into the magnetic layer 34 apply spin torque to the magnetization of the magnetic layer 34, to switch the magnetization direction of the magnetic layer 34 to the opposite direction from the magnetization of the magnetic layer 24.

Next, a read method is described. First, voltage is applied to the gate electrode 16, to put the spin transistor 1 into an ON state. In this state, current is made to flow between the stacked structure 20 and the stacked structure 30 via the channel region 13. Based on the amount of this current or the amount of the voltage between the magnetic layer 24 and the magnetic layer 34, a check is made to determine whether the spin transistor is in a low-resistance state or in a high-resistance state. In this manner, reading is performed.

(First Modification)

Figure 2:
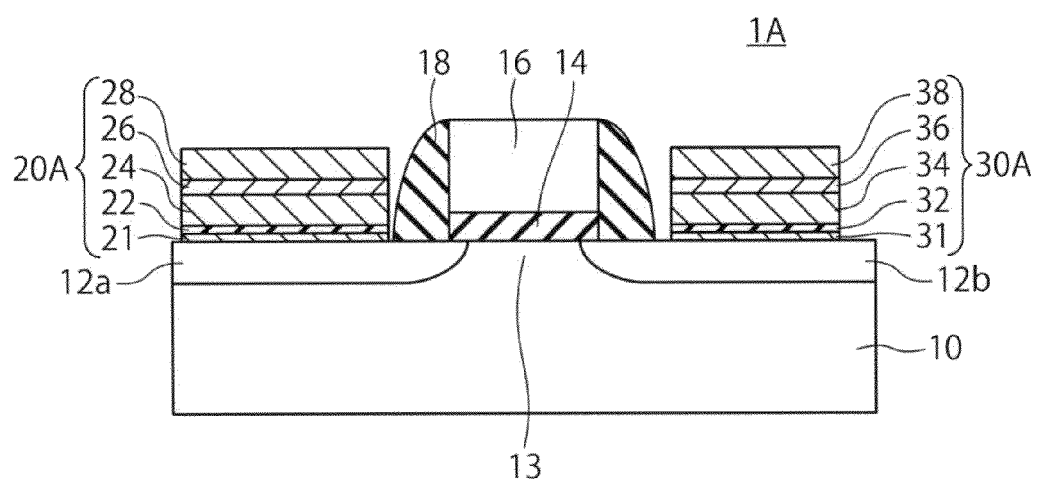
FIG. 2 is a cross-sectional view of a spin transistor according to a first modification of the first embodiment.

FIG. 2 shows a spin transistor according to a first modification of the first embodiment. A spin transistor 1A of the first modification differs from the spin transistor 1 of the first embodiment in that the stacked structures 20 and 30 formed on the source/drain regions 12a and 12b are replaced with stacked structures 20A and 30A, respectively.

The stacked structure 20A differs from the stacked structure 20 in that a nonmagnetic layer 26 formed on the magnetic layer 24 and a magnetic layer 28 formed on the nonmagnetic layer 26 are newly added. The magnetic layer 24 and the magnetic layer 28 are magnetically coupled to each other via the nonmagnetic layer 26. This magnetic coupling may be either antiferromagnetic coupling or ferromagnetic coupling. In view of a stray field, antiferromagnetic coupling is preferable.

The stacked structure 30A differs from the stacked structure 30 in that a nonmagnetic layer 36 formed on the magnetic layer 34 and a magnetic layer 38 formed on the nonmagnetic layer 36 are newly added. The magnetic layer 34 and the magnetic layer 38 are magnetically coupled to each other via the nonmagnetic layer 36. This magnetic coupling may be either antiferromagnetic coupling or ferromagnetic coupling. In view of a stray field, antiferromagnetic coupling is preferable. The magnetic layer 34 and the magnetic layer 38 may not be magnetically coupled to each other via the nonmagnetic layer 36. In such a case, spin torque that is twice as large is applied to the magnetization of the magnetic layer 34 when the magnetization direction of the magnetic layer 34 is reversed, and magnetization switching can be efficiently performed.

In the first modification, each of the magnetic layers 24, 28, 34, and 38 may have a magnetization direction perpendicular to the film plane, or may have a magnetization direction parallel to the film plane.

In the first modification, the area of the film plane of the stacked structure 20A on the source region 12a may be either smaller or larger than the area of the film plane of the stacked structure 30A on the drain region 12b, as in the first embodiment. The ratio in area is preferably 1.1 or higher, or more preferably, 1.2 or higher. Although the film plane of the stacked structure 20 formed on the source region 12a has the larger area in FIG. 2, the film plane of the stacked structure 30A formed on the drain region 12b may have the larger area.

(Second Modification)

Figure 3:
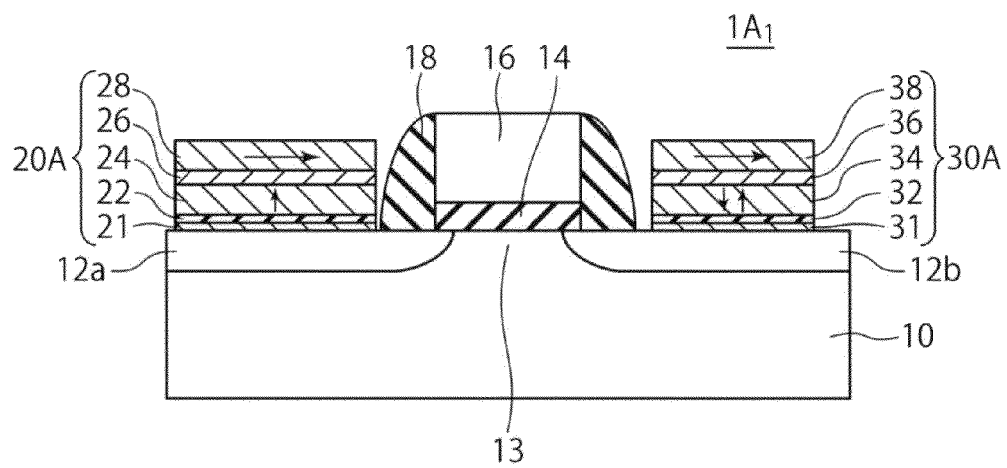
FIG. 3 is a cross-sectional view of a spin transistor according to a second modification of the first embodiment.

FIG. 3 shows a spin transistor according to a second modification of the first embodiment. A spin transistor $1A_1$ of the second modification differs from the spin transistor 1A of the first modification shown in FIG. 2 in that the magnetization directions of the magnetic layers 24 and 34 are perpendicular to the film plane, and the magnetization directions of the magnetic layers 28 and 38 are parallel to the film plane. That is, each of the stacked structures 20 and 30 includes two magnetic layers that have magnetization directions substantially perpendicular to each other.

With such a structure, spin injection efficiency becomes dramatically higher as will be described later in Example 4, and it becomes possible to perform high-speed magnetization switching in a shorter magnetization switching time τ than that in conventional cases, such as less than 10 nsec, or preferably, less than 1 nsec. Accordingly, writing can be performed at a higher speed than in the first modification.

(Third Modification)

Figure 4:
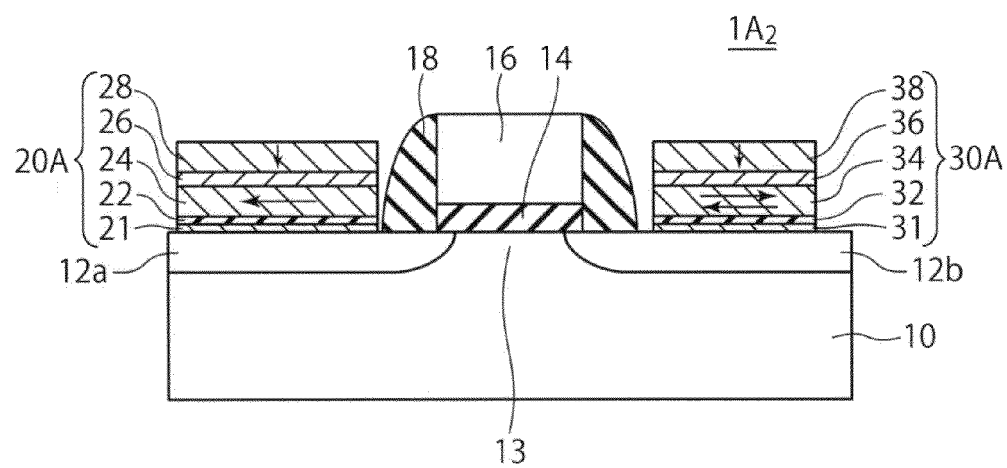
FIG. 4 is a cross-sectional view of a spin transistor according to a third modification of the first embodiment.

FIG. 4 shows a spin transistor according to a third modification of the first embodiment. A spin transistor $1A_2$ of the third modification differs from the spin transistor 1A of the first modification shown in FIG. 2 in that the magnetization directions of the magnetic layers 24 and 34 are parallel to the film plane, and the magnetization directions of the magnetic layers 28 and 38 are perpendicular to the film plane. That is, each of the stacked structures 20 and 30 includes two magnetic layers that have magnetization directions substantially perpendicular to each other.

With such a structure, spin injection efficiency becomes dramatically higher as in the second modification, and it becomes possible to perform high-speed magnetization switching in a shorter magnetization switching time than that in conventional cases, such as less than 10 nsec, or preferably, less than 1 nsec. Accordingly, writing can be performed at a higher speed than in the first modification.

(Fourth Modification)

Figure 5:
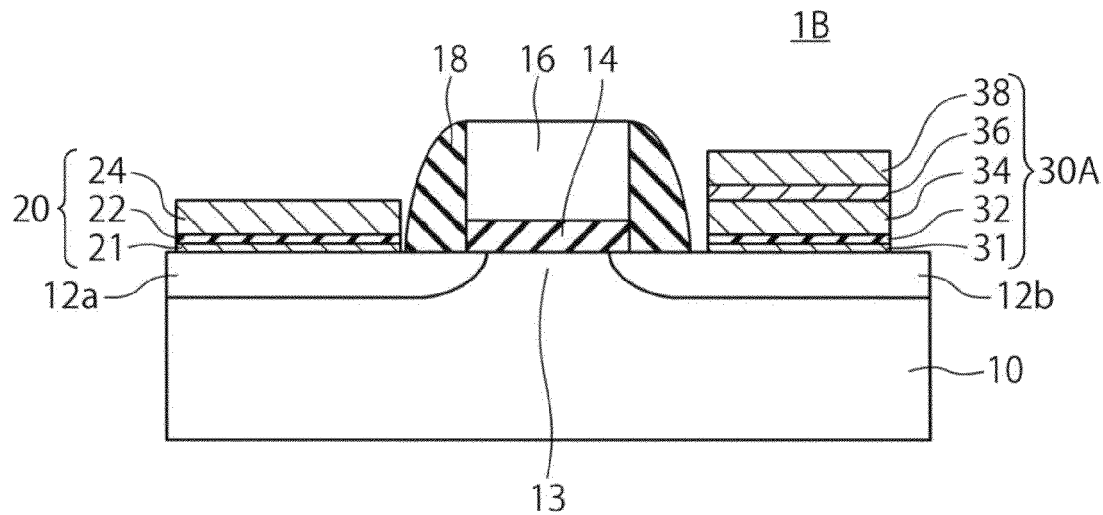
FIG. 5 is a cross-sectional view of a spin transistor according to a fourth modification of the first embodiment.

FIG. 5 shows a spin transistor according to a fourth modification of the first embodiment. A spin transistor 1B of the fourth modification differs from the spin transistor 1 of the first embodiment in that the stacked structure 30 formed on the drain region 12b is replaced with a stacked structure 30A. This stacked structure 30A has the same structure as that described in the first modification.

In the fourth modification, the area of the film plane of the stacked structure 20 on the source region 12a may be either smaller or larger than the area of the film plane of the stacked structure 30A on the drain region 12b, as in the first embodiment. The ratio in area is preferably 1.1 or higher, or more preferably, 1.2 or higher. Although the film plane of the stacked structure 20 formed on the source region 12a has the larger area in FIG. 5, the film plane of the stacked structure 30A formed on the drain region 12b may have the larger area.

(Fifth Modification)

Figure 6:
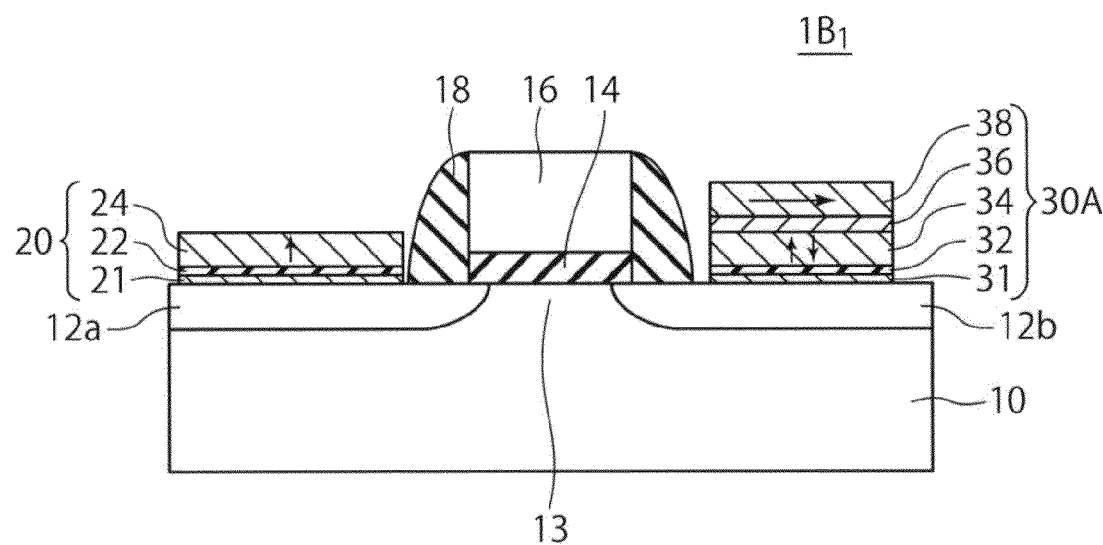
FIG. 6 is a cross-sectional view of a spin transistor according to a fifth modification of the first embodiment.

FIG. 6 shows a spin transistor according to a fifth modification of the first embodiment. A spin transistor $1B_1$ of the fifth modification differs from the spin transistor 1B of the fourth modification shown in FIG. 5 in that the magnetization directions of the magnetic layers 24 and 34 are perpendicular to the film plane, and the magnetization direction of the magnetic layer 38 is parallel to the film plane. That is, the stacked structure 30 includes the two magnetic layers 34 and 38 having magnetization directions substantially perpendicular to each other.

With such a structure, spin injection efficiency becomes dramatically higher, and it becomes possible to perform high-speed magnetization switching in a shorter magnetization switching time τ than that in conventional cases, such as less than 10 nsec, or preferably, less than 1 nsec. Accordingly, writing can be performed at a higher speed than in the fourth modification.

(Sixth Modification)

Figure 7:
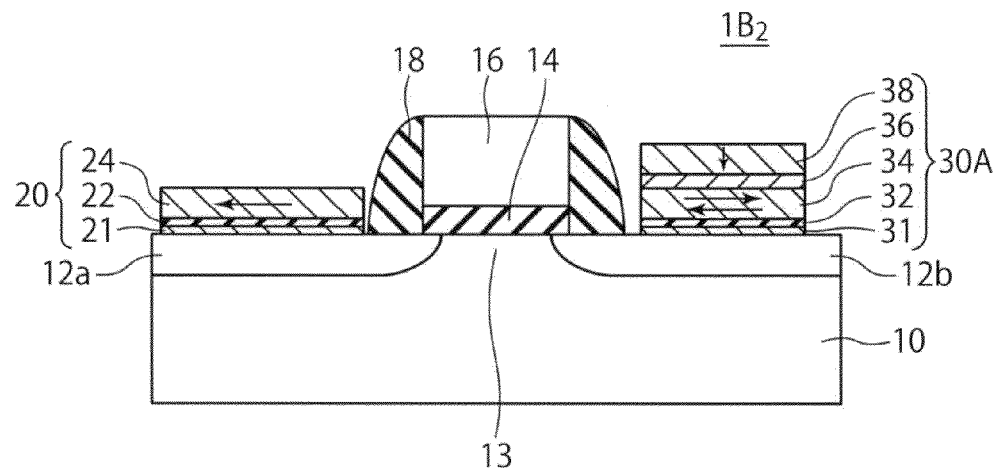
FIG. 7 is a cross-sectional view of a spin transistor according to a sixth modification of the first embodiment.

FIG. 7 shows a spin transistor according to a sixth modification of the first embodiment. A spin transistor $1B_2$ of the sixth modification differs from the spin transistor 1B of the fourth modification shown in FIG. 5 in that the magnetization directions of the magnetic layers 24 and 34 are parallel to the film plane, and the magnetization direction of the magnetic layer 38 is perpendicular to the film plane. That is, the stacked structure 30 includes the two magnetic layers 34 and 38 having magnetization directions substantially perpendicular to each other.

With such a structure, spin injection efficiency becomes dramatically higher, and it becomes possible to perform high-speed magnetization switching in a shorter magnetization switching time τ than that in conventional cases, such as less than 10 nsec, or preferably, less than 1 nsec. Accordingly, writing can be performed at a higher speed than in the fourth modification.

EXAMPLES

Next, examples of spin transistors according to the first embodiment are described.

Example 1

As Example 1, the spin transistor 1 of the first embodiment shown in FIG. 1 was manufactured in the following manner by using a Si semiconductor layer.

First, a device-isolating insulating film is formed on the Si semiconductor layer 10 by using LOCOS (Local Oxidation of Silicon), and a device region is formed. A gate is then formed by stacking the gate insulating film 14 and the gate electrode 16 in this order on the device region. With the gate serving as a mask, ions of an n-type impurity are injected into the semiconductor layer 10. After that, the gate sidewalls 18 are formed at the side portions of the gate. With the gate and the gate sidewalls 18 serving as masks, ions of a high-density n-type impurity are injected into the semiconductor layer 10, and RTA is performed. As a result, the $n^+$-layers are formed on the surfaces of the source/drain regions 12a and 12b. That is, the source/drain regions 12a and 12b turn into $n^+$-Si layers. The procedures described so far are carried out in the same manner as those in the conventional MOSFET manufacturing process.

The Zr layers 21 and 31 that are diatomic layers are then formed on the source/drain regions 12a and 12b. MgO layers of 0.8 nm in thickness are formed as the tunnel barrier layers 22 and 32 on the Zr layers 21 and 31, respectively. CoFe layers are formed as the magnetic layers 24 and 34 on the MgO layers 22 and 32, respectively. Ta layers are formed as cap layers on the CoFe layers 24 and 34, respectively. In this manner, the stacked structures 20 and 30 are formed on the source/drain regions 12a and 12b, respectively. That is, a diatomic Zr layer, an MgO layer, a CoFe layer, and a Ta layer are stacked in this order on each of the stacked structures 20 and 30. The size of a cross-section of each of the stacked structures 20 and 30 taken along a plane parallel to the semiconductor layer 10 is 0.1 μm×0.15 μm.

The spin transistor manufactured in this manner is sample 1, and a spin transistor that is the same as sample 1 except that the diatomic Zr layers 21 and 31 are replaced with diatomic Ti layers 21 and 31 is sample 2.

Comparative Example 1

As Comparative Example 1 of Example 1, a spin transistor having stacked structures formed by removing the Zr layers 21 and 31 from the respective stacked structures 20 and 30, or stacked structures each formed by stacking an MgO layer, a CoFe layer, and a Ta layer in this order on the source/drain region, is formed. (Junctional Resistances of Example 1 and Comparative Example 1)

In each of the spin transistors of sample 1 of Example 1 and Comparative Example 1, junctional resistance is evaluated from an ohmic electrode that is separately provided on the source region at a portion located in the depth direction in FIG. 1.

Figure 8:
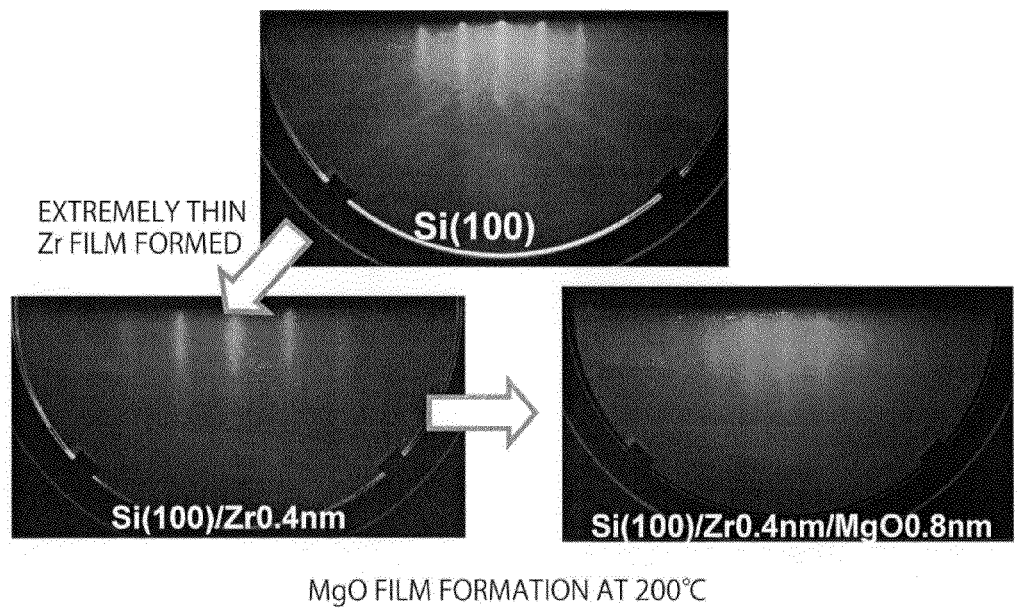
FIG. 8 shows RHEED photographs of Example 1.

FIG. 8 shows RHEED (Reflection High Energy Electron Diffraction) photographs of the stacked structures 20 and 30 of sample 1 of Example 1. FIG. 8 shows diffraction images that were taken when (diatomic) Zr layers of 0.4 nm in thickness were formed on Si (100), and MgO layers of 0.8 nm in thickness were formed on the Zr layers at 200° C. As is apparent from FIG. 8, the stacked structures in sample 1 of Example 1 were epitaxially grown. Likewise, in sample 2 of Example 1, the MgO layers of 0.8 nm in thickness on the Ti layers were epitaxially grown.

Figure 9:
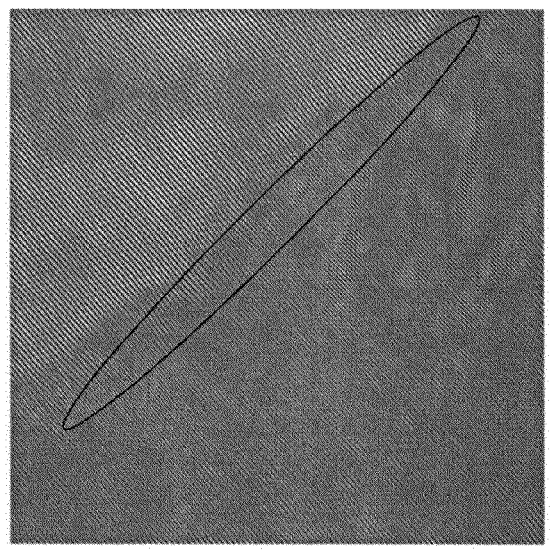
FIG. 9 shows an inverse Fourier transformation image of a TEM image of Comparative Example 1.

In a case where Zr layers were not formed as in Comparative Example 1, a region having epitaxial growth between an $n^+$-Si layer and an MgO layer and a region having a discontinuous lattice coexist as indicated in the portion surrounded by the solid line in FIG. 9. FIG. 9 shows an inverse Fourier transformation image of a TEM (Transmission Electron Microscope) image of a portion near the interface between the $n^+$-Si layer and the MgO layer.

Figure 10:
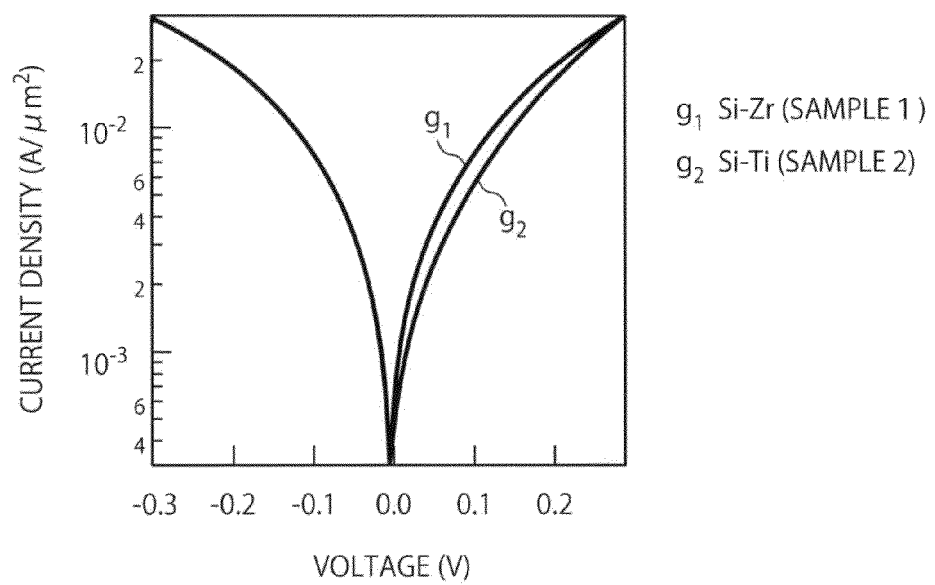
FIG. 10 is a diagram showing the J-V curves of the stacked structures of Example 1.

FIG. 10 shows the J-V curves of the stacked structures 20 and 30 in sample 1 and sample 2 of Example 1. In FIG. 10, the abscissa axis indicates the voltage V applied to the stacked structures 20 and 30, and the ordinate axis indicates the density J of the current flowing in the stacked structures 20 and 30. The J-V curves $g_1$ and $g_2$ shown in FIG. 10 represent the characteristics of sample 1 and sample 2 at an ambient temperature of 300 K, respectively. As can be seen from FIG. 10, the junctional resistance (Resistance area product (hereinafter also referred to as RA)) of Example 1 at a voltage of 300 mV is expressed as RA=10 Ωμm² (=0.3 V/(3×10⁻² A/μm²)).

On the other hand, the junctional resistance RA of Comparative Example 1 is RA=36 Ωμm², according to the findings of the inventors' study.

That is, in the stacked structures of sample 1 and sample 2 of Example 1, the junctional resistance RA becomes much lower than that of Comparative Example 1, and can cope with miniaturization down to F=20 nm. It is apparent that high-speed reading can be performed with the miniaturization size (F=20 nm) at a minimum.

In the stacked structures of sample 1 of Example 1, the Zr layers 21 and 31 at the interfaces between the $n^+$-Si layers and the MgO layers may be Si—Zr mixed layers. In the stacked structures of sample 2 of Example 1, the Ti layers 21 and 31 at the interfaces between the $n^+$-Si layer and the MgO layers may be Si—Ti mixed layers.

In Comparative Example 1, epitaxial growth was observed when an Mg layer was inserted between the layer 10 and the tunnel barrier layer 22. However, the junctional resistance RA becomes higher than that of Comparative Example 1. For example, while the junctional resistance of Comparative Example 1 is RA=36 Ωμm², the junctional resistance in the case where an Mg layer is inserted is RA=310 Ωμm², which is approximately nine times higher.

As described so far, by inserting a Zr layer or a Ti layer between the semiconductor layer 10 and each tunnel barrier layer, the junctional resistance can be made lower, and epitaxial growth is caused.

Although a Si layer is used as the semiconductor layer 10 in Example 1, the same effects as those achieved with a Si layer can be achieved when a SiGe layer, a Ge layer, or an InGaAs layer is used.

Also, the same effects can be achieved when $MgAl_2O_3$ (spinel) layers, instead of MgO layers, are used as the tunnel barrier layers.

Comparative Example 2

As Comparative Example 2, a spin transistor that differs from Example 1 in that each Zr layer is a hexatomic layer in terms of thickness, instead of a diatomic layer in terms of thickness, is manufactured. That is, each of the stacked structures in Comparative Example 2, a hexatomic Zr layer, an MgO layer, a CoFe layer, and a Ta layer are stacked in this order on the source/drain region.

Figure 11:
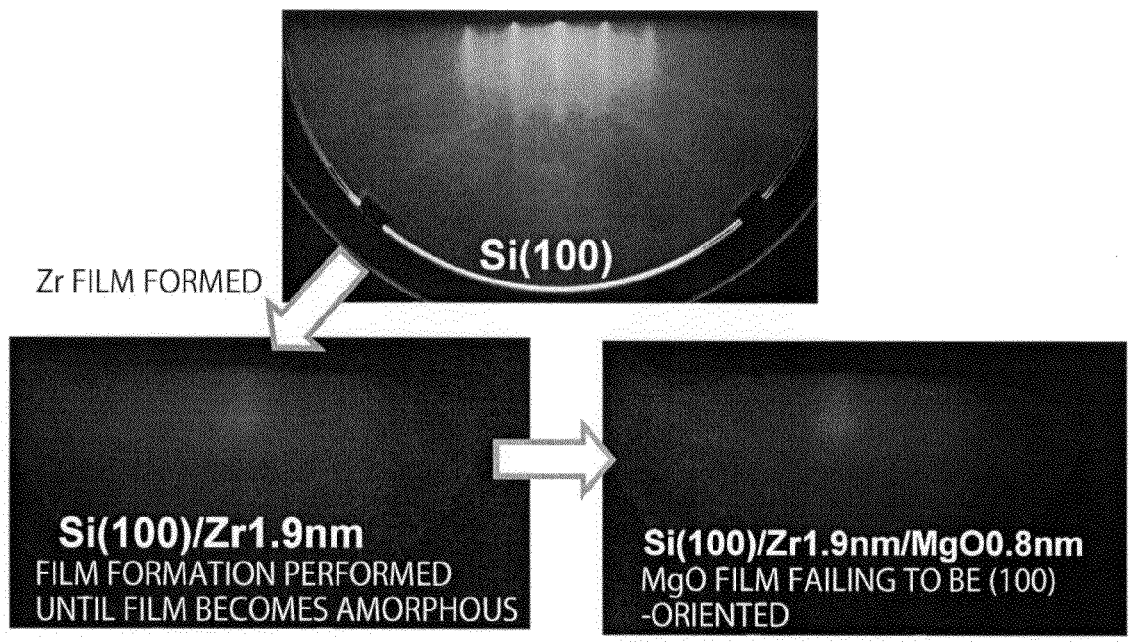
FIG. 11 shows RHEED photographs of the stacked structures in Comparative Example 2.

FIG. 11 shows RHEED photographs of a stacked structure in Comparative Example 2. FIG. 11 shows diffraction images that were taken when a Zr layer of 1.9 nm in thickness (hexatomic layer) was formed on Si (100), and an MgO layer of 0.8 nm in thickness was formed on the Zr layer at 200° C. As can be seen from FIG. 11, the stacked structure has an amorphous layer formed therein, but does not have epitaxial growth.

(Junctional Resistances of Sample 1 of Example 1 and Comparative Example 2)

Figure 12:
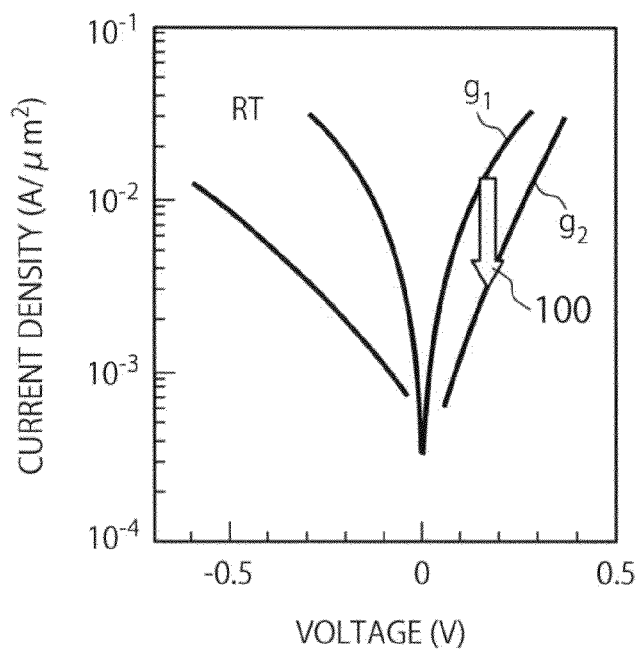
FIG. 12 is a diagram showing the J-V curves (characteristics) of the stacked structures in Example 1 and Comparative Example 2.

Junctional resistances of sample 1 of Example 1 and Comparative Example 2 were measured. FIG. 12 shows the results of measurement carried out to measure the J-V curves (characteristics) of the stacked structures in Example 1 and Comparative Example 2. In FIG. 12, the abscissa axis indicates the voltage V applied to the stacked structures, and the ordinate axis indicates the density J of the current flowing in the stacked structures. In FIG. 12, the characteristics $g_1$ are of sample 1 of Example 1, and the characteristics $g_2$ are of Comparative Example 2. As can be seen from FIG. 12, the junctional resistance RA of sample 1 of Example 1 at a voltage of 300 mV was 10 Ωμm². On the other hand, the junctional resistance RA of Comparative Example 2 was as high as 30 Ωμm² to 60 Ωμm², as indicated by the arrow 100 in FIG. 12. Therefore, it is apparent that the junctional resistance becomes higher when thick Zr layers are formed.

Example 2

Next, eight samples that were the same as sample 1 of Example 1 except that each of the Zr layers 21 and 31 was varied from a monoatomic layer to an octatomic layer by the monoatomic layer in terms of thickness were manufactured. Junctional resistance RA of each of those samples was measured, and the dependence of the junctional resistance RA on the thickness of the Zr layers is represented by graph $h_1$ in FIG. 13. Also, eight samples that were the same as sample 2 of Example 1 except that each of the Ti layers 21 and 31 was varied from a monoatomic layer to an octatomic layer by the monoatomic layer in terms of thickness were manufactured. Junctional resistance RA of each of those samples was measured, and the dependence of the junctional resistance RA on the thickness of the Ti layers is represented by graph $h_2$ in FIG. 13.

Figure 13:
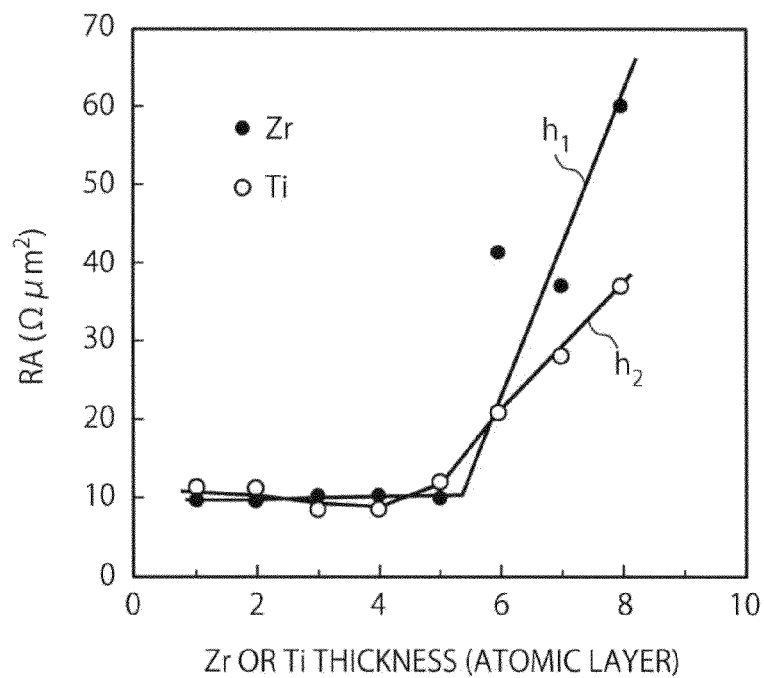
FIG. 13 is a diagram showing the dependence of junctional resistance RA on the thickness of the Zr layers.

As shown in FIG. 13, of the eight samples having a voltage of 300 mV applied thereto, each of the samples having Zr layers or Ti layers that are pentatomic layers or in terms of thickness has a low RA, which is approximately 10 Ωμm². However, each of the samples having Zr layers or Ti layers that are hexatomic layers in terms of thickness has a much higher RA. In a case where the thickness of each Zr layer is small (a triatomic layer to a tetratomic layer, for example), the Zr element in the Zr layers diffuses, and the Zr layers partially turn into Si—Zr mixed layers. However, even if Si—Zr mixed layers are formed in part of the Zr layers, or Si—Zr mixed layers are formed in place of the Zr layers, it is possible to achieve the same effects as those to be achieved in a case where Zr layers are formed. Likewise, in a case where the thickness of each Ti layer is small (a triatomic layer to a tetratomic layer, for example), the Ti element in the Ti layers diffuses, and the Ti layers partially turn into Si—Ti mixed layers. However, even if Si—Ti mixed layers are formed in part of the Ti layers, or Si—Ti mixed layers are formed in place of the Ti layers, it is possible to achieve the same effects as those to be achieved in a case where Ti layers are formed.

As can be seen from Example 2, each of the Zr layers or Ti layers is preferably a monoatomic layer to a pentatomic layer in terms of thickness, to achieve a preferred junctional resistance. Where each of the Zr layers or Ti layers is a monoatomic layer to a pentatomic layer in terms of thickness, the Zr layers or Ti layers are not in an amorphous state. Accordingly, for example the MgO layers serving as the tunnel barrier layers formed on the Zr layers or Ti layers are easily oriented. If each of the Zr layers or Ti layers is a hexatomic layer or greater in terms of thickness, the Zr layers or Ti layers are in an amorphous state, and for example the MgO layers serving as the tunnel barrier layers formed on the Zr layers or Ti layers are not easily oriented.

Example 3

As example 3, stacked structures are formed on the source/drain regions 12a and 12b that are n⁺-Si layers. The stacked structures include Zr layers 21 and 31 that are triatomic layers in terms of thickness, MgO layers that are tunnel barrier layers 22 and 32 formed on the Zr layers 21 and 31, CoFe layers that are the magnetic layers 24 and 34 formed on the MgO layers, and Ta cap layers formed on the CoFe layers. Example 3 has the same structure as sample 1 of Example 1, except that the Zr layers 21 and 31 are triatomic layers in terms of thickness.

Figure 14:
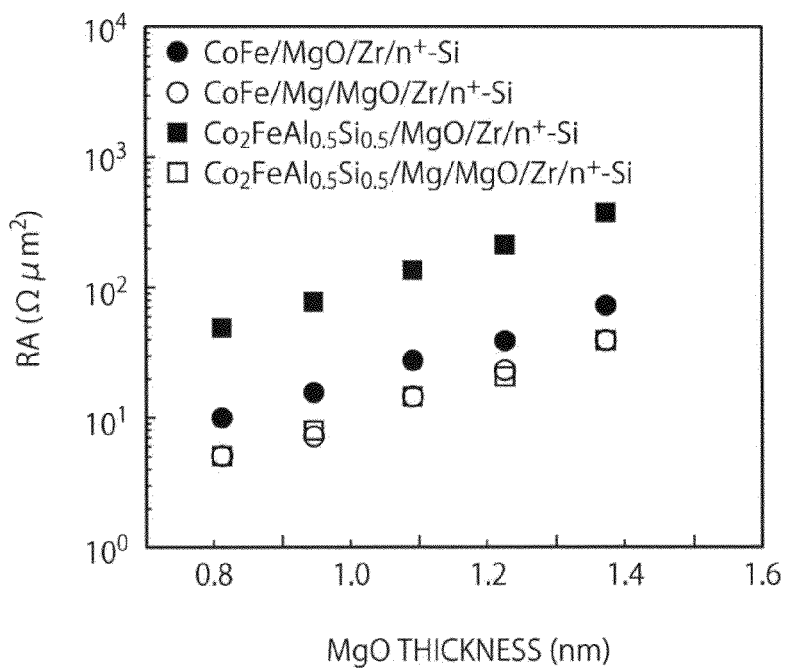
FIG. 14 is a diagram showing the dependence of junctional resistance RA on the thickness of the MgO layers.

In Example 3, five samples of samples 1 through 5 in which the MgO layers serving as the tunnel barrier layers 22 and 32 are varied in thickness are prepared. The results of measurement carried out to measure junctional resistances RA of samples 1 through 5 when a voltage of 300 mV was applied to the stacked structures are indicated by the black circles in FIG. 14. In FIG. 14, the abscissa axis indicates thickness of each of the MgO layers, and the ordinate axis indicates junctional resistance RA.

Samples 6 through 10 are also prepared. Samples 6 through 10 are the same as samples 1 through 5, respectively, except that Mg layers of 0.6 nm in thickness are inserted between the MgO layers and the CoFe layers. The results of measurement carried out to measure junctional resistances RA of samples 6 through 10 when a voltage of 300 mV was applied to the stacked structures are indicated by the white circles in FIG. 14.

Samples 11 through 15 are also prepared. Samples 11 through 15 are the same as samples 1 through 5, respectively, except that the CoFe layers are replaced with Heusler alloy layers such as $Co_2FeAl_{0.5}Si_{0.5}$ layers. The results of measurement carried out to measure junctional resistances RA of samples 11 through 15 when a voltage of 300 mV was applied to the stacked structures are indicated by the black squares in FIG. 14.

Samples 16 through 20 are also prepared. Samples 16 through 20 are the same as samples 6 through 10, respectively, except that the CoFe layers are replaced with Heusler alloy layers such as $Co_2FeAl_{0.5}Si_{0.5}$ layers. The results of measurement carried out to measure junctional resistances RA of samples 16 through 20 when a voltage of 300 mV was applied to the stacked structures are indicated by the white squares in FIG. 14.

As can be seen from FIG. 14, the junctional resistance RA is lowered by inserting Mg layers between the tunnel barrier layers and the magnetic layers. For example, the junctional resistance achieved in a case where the magnetic layers are CoFe layers decreases to ½ of the junctional resistance achieved in a case where Mg layers are not provided, and the junctional resistance achieved in a case where the magnetic layers are $Co_2FeAl_{0.5}Si_{0.5}$ layers decreases to 1/10 of the junctional resistance achieved in a case where Mg layers are not provided. Where $Co_2FeSi$ layers, instead of $Co_2FeAl_{0.5}Si_{0.5}$ layers, are used as the magnetic layers, the same effects as above can also be achieved.

As Zr layers or Ti layers are provided, high-speed reading can be performed even if miniaturization is performed down to the F=20 nm generation. However, where Mg layers are inserted between the magnetic layers and the tunnel barrier layers, it is possible to cope with miniaturization down to the F<20 nm (F=1X nm) generation. Also, epitaxial growth was confirmed where Mg layers were inserted. Accordingly, spin injection is not affected. The same effects as above can also be achieved in a case where $MgAl_2O_3$ (spinel) layers, instead of MgO layers, are used as the tunnel barrier layers.

As described above, in a case where MgO (100) layers or disordered $MgAl_2O_3$ (100) layers in which the Mg sites and the Al sites are disordered are used as the tunnel barrier layers 22 and 24 formed on the Zr layers 21 and 31 or the Si—Zr layers 21 and 31, which are pentatomic layers or smaller, the MgO (100) layers or the $MgAl_2O_3$ (100) layers are epitaxially grown on the semiconductor (100) layer (such as a Si (100) layer, a SiGe (100) layer, a Ge (100) layer, or an InGaAs (100) layer) via the Zr layers or the Si—Zr layers, which are pentatomic layers or smaller. As the epitaxial growth of the tunnel barrier layers is (100)-oriented, the spin injection efficiency into the semiconductor becomes higher. The same applies in a case where Ti is used, instead of Zr.

Example 4

As Example 4, the spin transistor $1A_1$ according to the second modification of the first embodiment shown in FIG. 3 was formed on the Si semiconductor layer 10. The stacked structures 20A and 30A formed on the source/drain regions 12a and 12b include Zr layers 21 and 31 that are triatomic layers formed on the $n^+$-Si layer 10, MgO layers 22 and 32 of 0.8 to 1.38 nm in thickness, $Co_{40}Fe_{60}$ layers 24 and 34, Ta layers 26 and 36, $Co_{90}Fe_{10}$ layers 28 and 38, and Ta layers (not shown) formed as cap layers. The stacked structures 20A and 30A were formed by using the same method as that used in Example 1.

Figure 15:
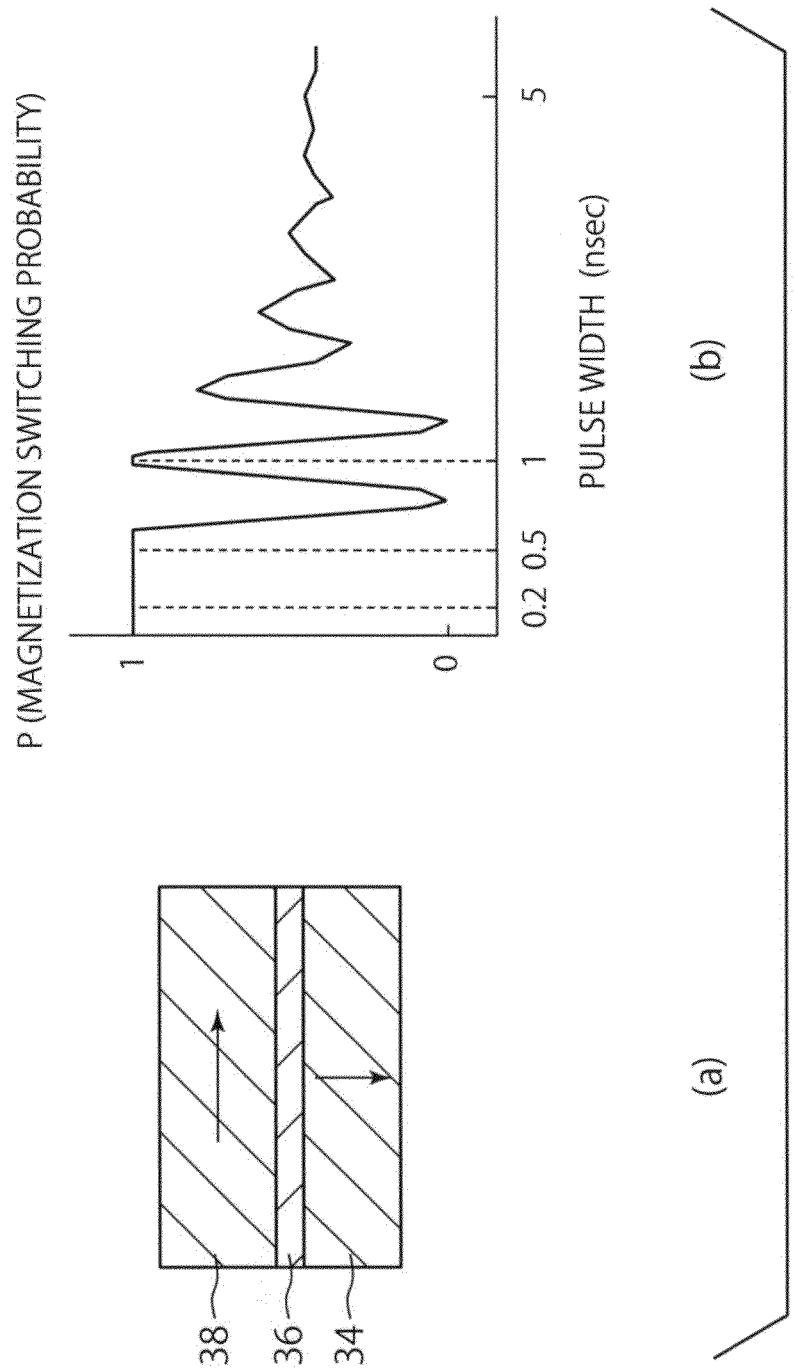
FIGS. 15(a) and 15(b) are diagrams for explaining the dependence of a magnetization switching probability on the pulse width in Example 4.

FIG. 15(b) shows the magnetization switching probability (the switching probability) observed when a write current having a varying pulse width is applied to the magnetic layer 34, the nonmagnetic layer 36, and the magnetic layer 38 of the stacked structure 30A in the spin transistor of Example 4. FIG. 15(a) is a cross-sectional view of the magnetic layer 34, the nonmagnetic layer 36, and the magnetic layer 38 of the stacked structure 30A. As can be seen from FIG. 15(b), a switching probability of 100% is achieved in the monopulse region of 500 psec or less in pulse width. Accordingly, with the structure according to the second modification of the first embodiment shown in FIG. 3, high-speed writing can be performed. More preferably, the pulse width should be 200 psec or less.

Although the spin transistor of Example 4 was formed on the Si semiconductor layer 10, the same effects as above can be achieved by forming the spin transistor on a SiGe layer, a Ge layer, or an InGaAs layer. Also, the same effects can be achieved by using $MgAl_2O_3$ (spinel) layers as the tunnel barrier layers 22 and 32 instead of MgO layers.

Example 5

As Example 5, the spin transistor 1B according to the third modification of the first embodiment shown in FIG. 4 was formed on the Si semiconductor layer 10. The stacked structures 20A and 30A formed on the source/drain regions 12a and 12b include Zr layers 21 and 31 that are triatomic layers formed on the $n^+$-Si layer 10, MgO layers 22 and 32 of 0.8 nm to 1.38 nm in thickness, $Co_{80}Fe_{20}$) layers 24 and 34, Ta layers 26 and 36, $Co_{40}Fe_{60}$ layers 28 and 38, and Ta layers (not shown) formed as cap layers. The stacked structures 20A and 30A were formed by using the same method as that used in Example 1.

Figure 16:
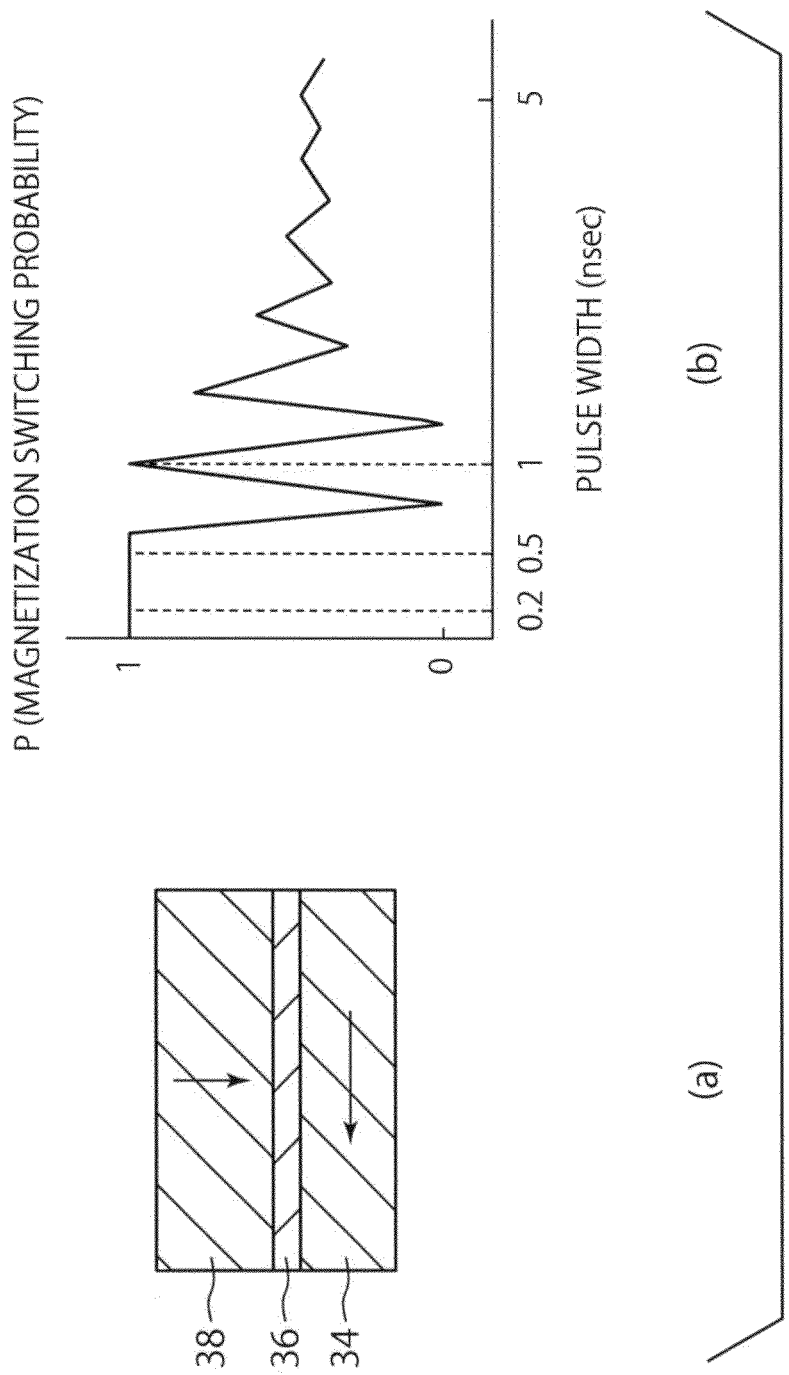
FIGS. 16(a) and 16(b) are diagrams for explaining the dependence of a magnetization switching probability on the pulse width in Example 5.

FIG. 16(b) shows the magnetization switching probability (the switching probability) observed when a write current having a varying pulse width is applied to the magnetic layer 34, the nonmagnetic layer 36, and the magnetic layer 38 of the stacked structure 30A in the spin transistor of Example 5. FIG. 16(a) is a cross-sectional view of the magnetic layer 34, the nonmagnetic layer 36, and the magnetic layer 38 of the stacked structure 30A. As can be seen from FIG. 16(b), a switching probability of 100% is achieved in the monopulse region of 500 psec or less in pulse width. Accordingly, with the structure according to the third modification of the first embodiment shown in FIG. 4, high-speed writing can be performed. More preferably, the pulse width should be 200 psec or less.

Although the spin transistor of Example 5 was formed on the Si semiconductor layer 10, the same effects as above can be achieved by forming the spin transistor on a SiGe layer, a Ge layer, or an InGaAs layer. Also, the same effects can be achieved by using $MgAl_2O_3$ (spinel) layers as the tunnel barrier layers 22 and 32, instead of MgO layers.

As the ferromagnetic layers 24, 34, 28, and 38 in the first embodiment and the modifications thereof, a Ni—Fe alloy, a Co—Fe alloy, or a Co—Fe—Ni alloy can be used. Alternatively, it is possible to use an amorphous material such as a (Co, Fe, Ni)—(B) material, a (Co, Fe, Ni)—(B)—(P, Al, Mo, Nb, Mn) material, or a Co—(Zr, Hf, Nb, Ta, Ti) material. Also, it is possible to use a full-Heusler material such as a $Co_2FeAl_xSi_{1-x}$ material, a $Co_2MnAl_xSi_{1-x}$ material, $Co_2MnSi$, $Co_2FeSi$, or a $Co_2Mn_{1-x}Fe_xSi$ material.

As the ferromagnetic layers 24, 34, 28, and 38, a monolayer film of Fe—Pd, Fe—Pt, or Fe—Pd—Pt can also be used. Alternatively, it is possible to use a Co/Ni film stack, a Fe/Pd film stack, a Fe/Pt film stack, a bilayer film formed with a first ferromagnetic layer and a second ferromagnetic layer, or a trilayer formed with a first ferromagnetic layer, a nonmagnetic layer, and a second ferromagnetic layer. The nonmagnetic layers 26 and 36 are made of a material selected from Ta, Ru, Cu, Ag, Au, TiN, TiB, TaB, TiTaB, and TiTaN.

An antiferromagnetic film may be provided in contact with the upper magnetic layer of at least one of the stacked structures on the source/drain regions. As the antiferromagnetic film, one of a PtMn film, an Ir—Mn film, a FeMn film, a Pt—Cr—Mn film, or a Ni—Mn film is used, for example. The antiferromagnetic film is also provided when the spin orientation is to be pinned. However, thermal stability can be increased by providing the antiferromagnetic film on a magnetic layer having a switchable magnetization direction.

As described so far, each of the first embodiment, the modifications thereof, and Examples thereof can provide stacked structures having a low junctional resistance and a spin transistor including such stacked structures. With the stacked structures and the spin transistor, high-speed reading and high-speed writing can be performed.

Second Embodiment

Figure 17:
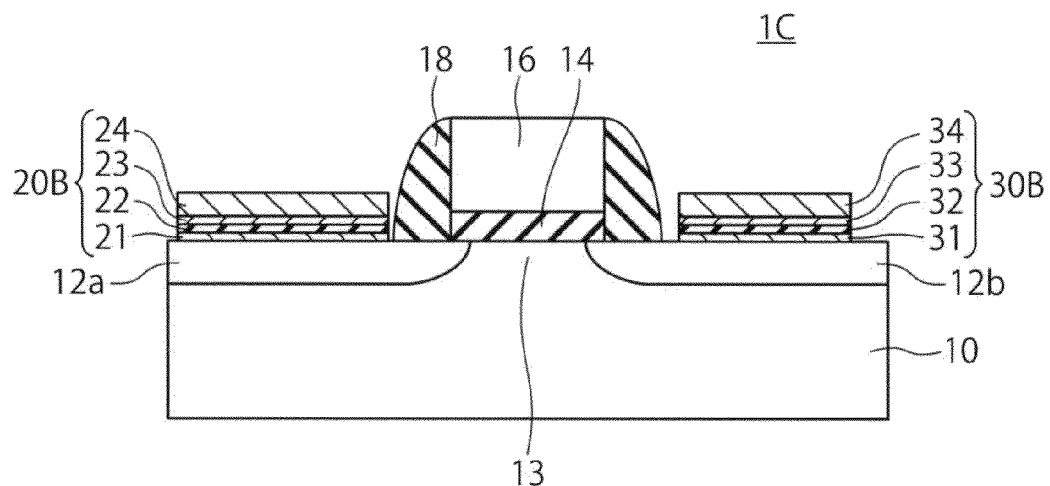
FIG. 17 is a cross-sectional view of a spin transistor according to a second embodiment.

FIG. 17 shows a spin transistor according to a second embodiment. A spin transistor 1C of the second embodiment is the same as the spin transistor 1 of the first embodiment shown in FIG. 1, except that the stacked structures 20 and 30 are replaced with stacked structures 20B and 30B, respectively. The stacked structure 20B is the same as the stacked structure 20, except that an Mg layer 23 is inserted between the tunnel barrier layer 22 and the magnetic layer 24. The stacked structure 30B is the same as the stacked structure 30, except that an Mg layer 33 is inserted between the tunnel barrier layer 32 and the magnetic layer 34. That is, the stacked structures 20B and 30B have structures equivalent to samples 6 through 10 described in Example 3 of the first embodiment.

Accordingly, the spin transistor 1C of the second embodiment has a lower junctional resistance than that of the first embodiment as described in Example 3, and reading can be performed at a higher speed than in the first embodiment.
(First Modification)

Figure 18:
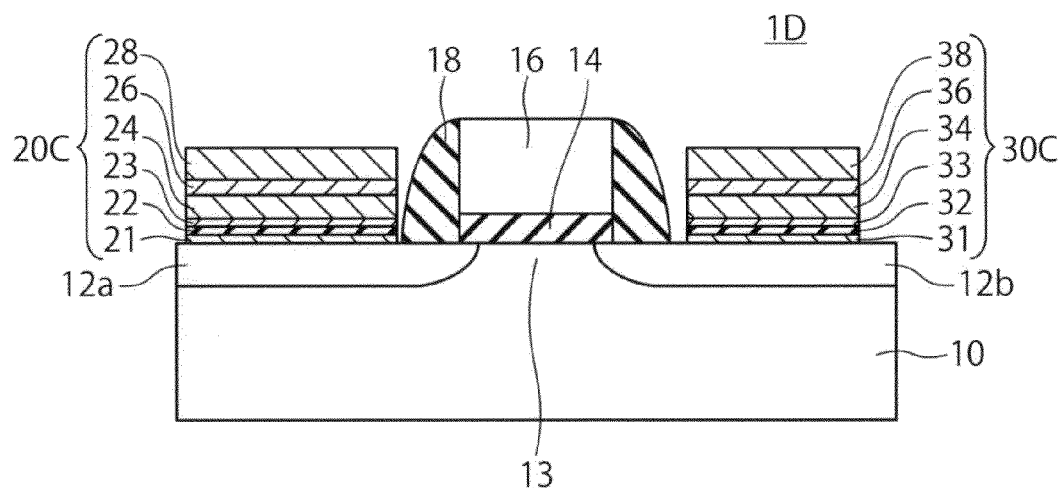
FIG. 18 is a cross-sectional view of a spin transistor according to a first modification of the second embodiment.

FIG. 18 shows a spin transistor according to a first modification of the second embodiment. A spin transistor 1D of the first modification is the same as the spin transistor according to the first modification of the first embodiment shown in FIG. 2, except that the stacked structures 20A and 30A are replaced with stacked structures 20C and 30C, respectively. The stacked structure 20C is the same as the stacked structure 20A, except that an Mg layer 23 is inserted between the tunnel barrier layer 22 and the magnetic layer 24. The stacked structure 30C is the same as the stacked structure 30A, except that an Mg layer 33 is inserted between the tunnel barrier layer 32 and the magnetic layer 34.

The spin transistor 1D of the first modification has an even lower junctional resistance than that of the first modification of the first embodiment as in the second embodiment, and reading can be performed at an even higher speed than in the first modification of the first embodiment.
(Second Modification)

Figure 19:
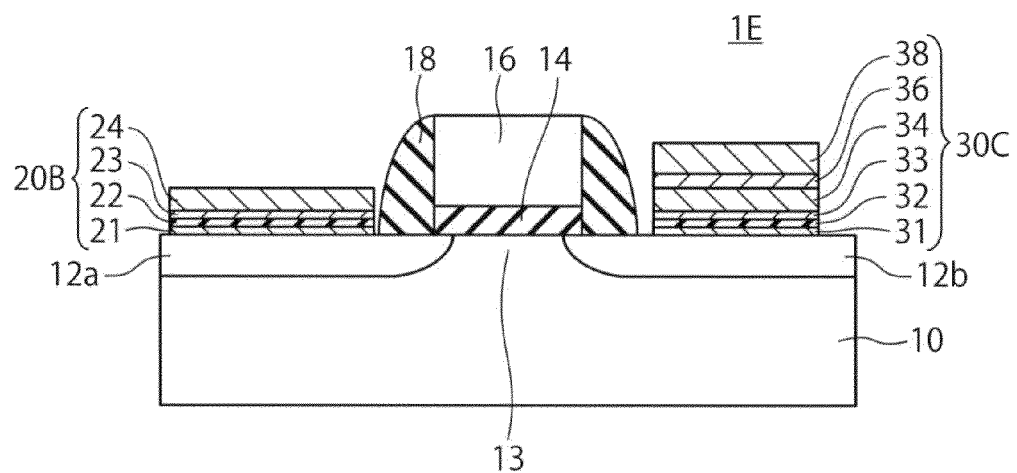
FIG. 19 is a cross-sectional view of a spin transistor according to a second modification of the second embodiment.

FIG. 19 shows a spin transistor according to a second modification of the second embodiment. A spin transistor 1E of the second modification is the same as the spin transistor according to the fourth modification of the first embodiment shown in FIG. 5, except that the stacked structures 20A and 30A are replaced with stacked structures 20B and 30C, respectively. As described in the second embodiment, the stacked structure 20B is the same as the stacked structure 20A, except that an Mg layer 23 is inserted between the tunnel barrier layer 22 and the magnetic layer 24. As described in the first modification of the second embodiment, the stacked structure 30C is the same as the stacked structure 30A, except that an Mg layer 33 is inserted between the tunnel barrier layer 32 and the magnetic layer 34.

The spin transistor 1E of the second modification has an even lower junctional resistance than that of the fourth modification of the first embodiment as in the second embodiment, and reading can be performed at an even higher speed than in the fourth modification of the first embodiment.

In each of the second embodiment and the modifications thereof, the Zr-containing layers 21 and 31 may be replaced with Ti-containing layers 21 and 31. Alternatively, the Zr-containing layers 21 and 31 may be replaced with Hf-containing layers 21 and 31.

Third Embodiment

Figure 20:
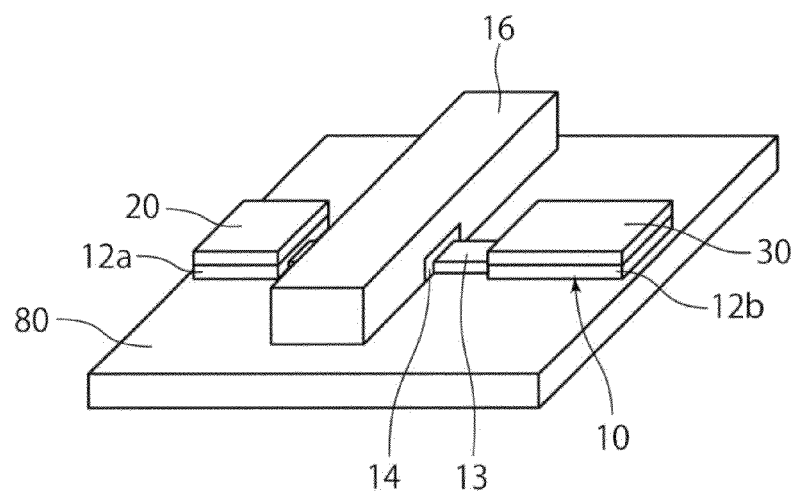
FIG. 20 is a perspective view of a spin transistor according to a third embodiment.

FIG. 20 shows a spin transistor according to a third embodiment. The spin transistor of the third embodiment is a nanowire-type spin transistor that is the same as the spin transistor 1 of the first embodiment, except that the channel region 13 is narrower than the source/drain regions 12a and 12b.

The spin transistor of the third embodiment is formed on a semiconductor layer 10 placed on an insulating film 80. The semiconductor layer 10 includes a source region 12a and a drain region 12b that are formed at a distance from each other, and a channel region 13 that connects the source region 12a and the drain region 12b, and has a smaller width than the source region 12a and the drain region 12b. The channel region 13 has a rectangular shape, for example.

The side surfaces and the upper surface of the channel region 13 are covered with a gate insulating film 14, and a gate electrode 16 is provided to cover the side surfaces and the upper surface of the channel region 13 via the gate insulating film 14. The gate insulating film 14 should be provided to cover at least the side surfaces of the channel region 13, and may not be provided on the upper surface of the channel region 13. In that case, a mask (not shown) made of an insulator is provided between the upper surface of the channel region 13 and the gate electrode 16, and patterning is performed on the semiconductor layer 10 by using the mask. In this manner, a channel region is formed.

Stacked structures 20 and 30 are formed on the source region 12a and the drain region 12b, as in the first embodiment illustrated in FIG. 1. Specifically, the stacked structure 20 includes a Zr layer 21 formed on the source region 12a, a tunnel barrier layer 22 formed on the Zr layer 21, and a magnetic layer 24 formed on the tunnel barrier layer 22, as shown in FIG. 1. Likewise, the stacked structure 30 includes a Zr layer 31 formed on the drain region 12b, a tunnel barrier layer 32 formed on the Zr layer 31, and a magnetic layer 34 formed on the tunnel barrier layer 32.

The third embodiment having the above structure can dramatically reduce interfacial resistance. Particularly, this effect becomes greater in a case where the magnetic layers 24 and 34 are made of a Heusler alloy or an ordered alloy such as Fe—Pt or Fe—Pd.

Figure 21:
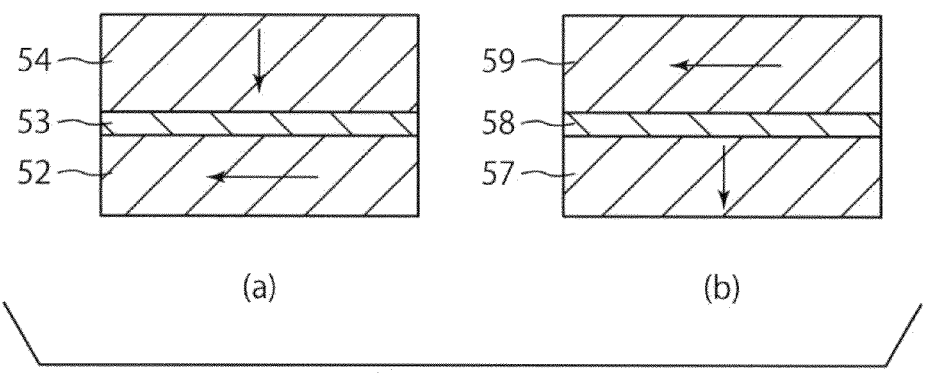
FIGS. 21(a) and 21(b) are diagrams showing preferred stacked structures formed with magnetic layers used in the spin transistor of the third embodiment.

As shown in FIG. 21(a), each of the magnetic layers 24 and 34 may be a trilayer structure that is formed by stacking a ferromagnetic film 52, a nonmagnetic metal film 53, and a ferromagnetic film 54 in this order. The magnetization direction of the ferromagnetic film 52 is parallel to the film plane, and the magnetization direction of the ferromagnetic film 54 is perpendicular to the film plane. In such a case, magnetization switching can be performed at a high speed.

Alternatively, as shown in FIG. 21(b), each of the magnetic layers 24 and 34 may be a trilayer structure that is formed by stacking a ferromagnetic film 57, a nonmagnetic metal film 58, and a ferromagnetic film 59 in this order. The magnetization direction of the ferromagnetic film 57 is perpendicular to the film plane, and the magnetization direction of the ferromagnetic film 59 is parallel to the film plane. In such a case, magnetization switching can be performed at a high speed, as in the case illustrated in FIG. 21(a).

The third embodiment can provide stacked structures having a low junctional resistance, and a spin transistor including the stacked structures, as in the first embodiment. With the stacked structures and the spin transistor, high-speed reading and high-speed writing can be performed.

In the third embodiment, the Zr-containing layers 21 and 31 may be replaced with Ti-containing layers 21 and 31. Alternatively, the Zr-containing layers 21 and 31 may be replaced with Hf-containing layers 21 and 31.

The spin transistor of the third embodiment can be applied to the spin transistors of the modifications of the first embodiment, the second embodiment, and the modifications of the second embodiment.

Fourth Embodiment

Figure 22:
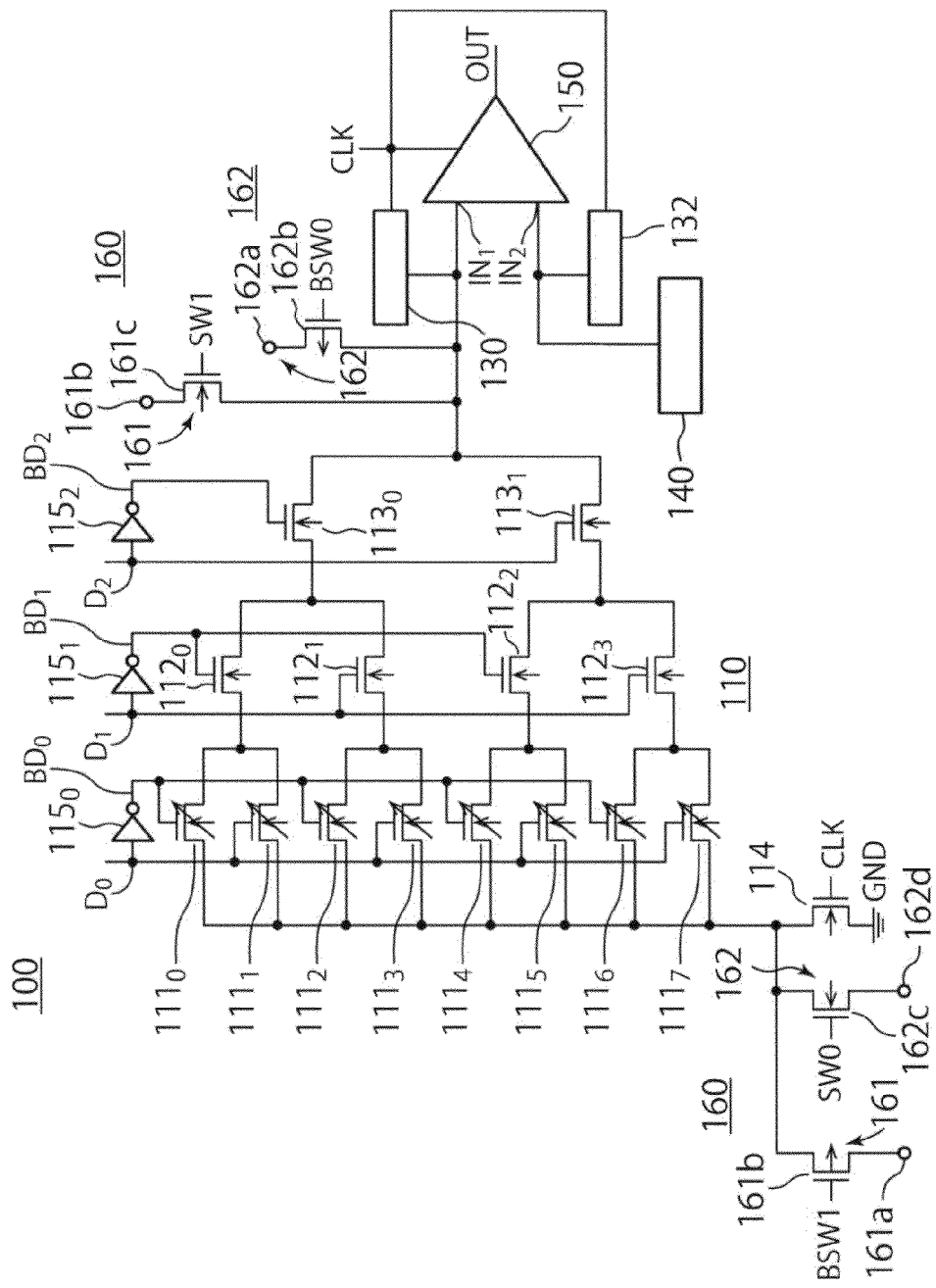
FIG. 22 is a circuit diagram showing the look-up table circuit of a reconfigurable logic circuit according to a fourth embodiment.
Figure 23:
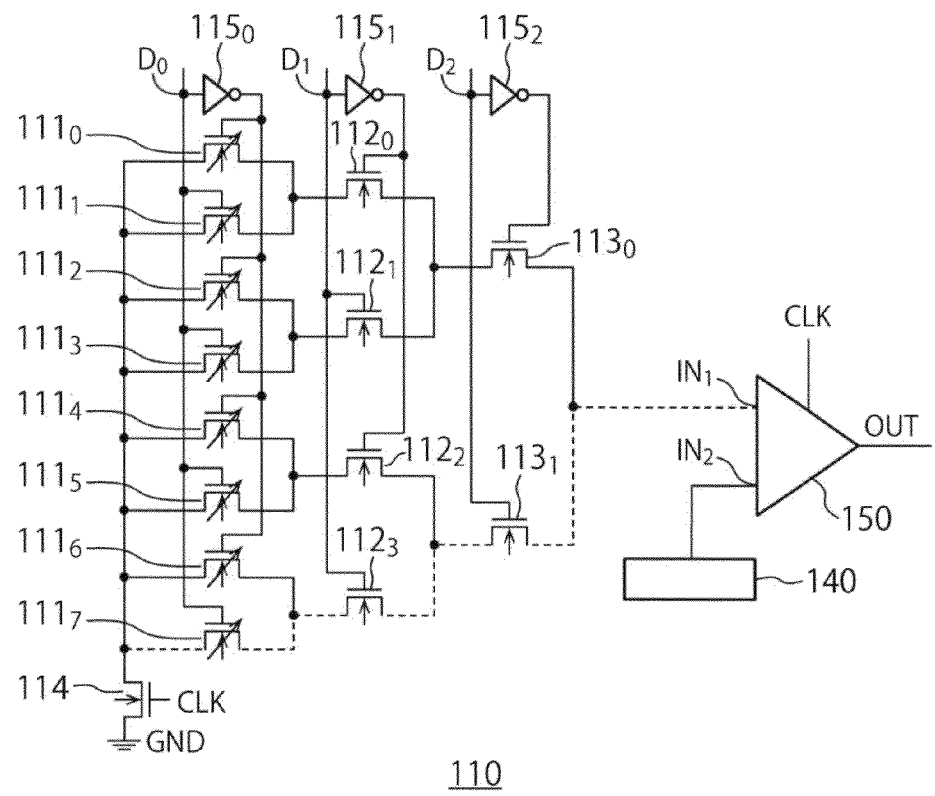
FIG. 23 is a diagram for explaining a conduction state of the multiplexer included in the logic circuit shown in FIG. 22.

Referring now to FIGS. 22 and 23, a reconfigurable logic circuit according to a fourth embodiment is described. The reconfigurable logic circuit of the fourth embodiment includes a look-up table circuit that is shown in FIG. 22. The look-up table circuit 100 according to this embodiment includes a multiplexer 110, current supply sources 130 and 132, a reference unit 140, a comparator 150, and a write circuit 160.

The multiplexer 110 in this embodiment is an eight-input, one-output multiplexer, and includes three control lines $D_0$, $D_1$, and $D_2$, eight n-channel spin MOSFETs $111_0$ through $111_7$, four n-type MOSFETs $112_0$ through $112_3$, two n-type MOSFETs $113_0$ and $113_1$, one n-type MOSFET 114, three inverters $115_0$, $115_1$, and $115_2$, and three inversion control lines $BD_0$, $BD_1$, and $BD_2$. As the n-channel spin MOSFETs $111_0$ through $111_7$, spin transistors according to one of the first through third embodiments and the modifications thereof are used.

Each inverter $115_i$ (i=0, 1, and 2) has an input terminal connected to the corresponding control line $D_i$, and has an output terminal connected to the corresponding inversion control line $BD_i$. That is, the control signal flowing through the inversion control line $BD_i$ is the inverted control signal of the control signal flowing in the control line $D_i$.

The eight spin MOSFETs $111_0$ through $111_7$ each have the source connected to the ground source GND via the MOSFET 114. A clock signal CLK is input to the gate of the MOSFET 114. The four spin MOSFETs $111_0$, $111_2$, $111_4$, and $111_6$ each have the gate connected to the inversion control line $BD_0$, and the four spin MOSFETs $111_1$, $111_3$, $111_5$, and $111_7$ each have the gate connected to the control line $D_0$.

The two spin MOSFETs $111_0$ and $111_1$ each have the drain connected to the source of the MOSFET $112_0$, the two spin MOSFETs $111_2$ and $111_3$ each have the drain connected to the source of the MOSFET $112_1$, the two spin MOSFETs $111_4$ and $111_5$ each have the drain connected to the source of the MOSFET $112_2$, and the two spin MOSFETs $111_6$ and $111_7$ each have the drain connected to the source of the MOSFET $112_3$.

The two MOSFETs $112_0$ and $112_2$ each have the gate connected to the inversion control line $BD_1$, and the two MOSFETs $112_1$ and $112_3$ each have the gate connected to the control line $D_1$. The two MOSFETs $112_0$ and $112_1$ each have the drain connected to the source of the MOSFET $113_0$, and the two MOSFETs $112_2$ and $112_3$ each have the drain connected to the source of the MOSFET $113_1$.

The MOSFET $113_0$ has the gate connected to the inversion control line $BD_2$, and has the drain connected to a first input terminal $IN_1$ of the comparator 150. The MOSFET $113_1$ has the gate connected to the control line $D_2$, and has the drain connected to the first input terminal $IN_1$ of the comparator 150.

In the multiplexer 110 having the above structure, the potential levels of the three control lines $D_0$, $D_1$, and $D_2$ are controlled when the clock signal CLK is at "H" level, so that one spin MOSFET is selected from the eight spin MOSFETs $111_0$ through $111_7$, and the first input terminal $IN_1$ of the comparator 150 and the ground source GND can be connected via the selected spin MOSFET. For example, when the clock signal CLK is at "H" level, the MOSFET 114 is turned on, and the sources of the eight spin MOSFETs $111_0$ through $111_7$ are at the ground potential level. If all the three control lines $D_0$, $D_1$, and $D_2$ are at the high potential level in this case, the first input terminal $IN_1$ of the comparator 150 is electrically connected to the ground source GND via the passage indicated by the dashed line in FIG. 23, or the passage extending through the MOSFET $113_1$, the MOSFET $112_3$, and the spin MOSFET $111_7$. That is, the spin MOSFET $111_7$ is selected, and is connected to the first input terminal $IN_1$ of the comparator 150 in this case.

The look-up table circuit of the fourth embodiment has a much smaller number of components than that in a look-up table circuit that is formed only with n-type MOSFETs without spin MOSFETs. Accordingly, the reconfigurable logic circuit can have a higher degree of integration or reduce power consumption.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A stacked structure comprising:
    a semiconductor layer;
    a first layer formed on the semiconductor layer, the first layer containing at least one element selected from Zr, Ti, and Hf, the first layer being not less than 1 atomic layer and not more than 5 atomic layers;
    a tunnel barrier layer formed on the first layer; and
    a magnetic layer formed on the tunnel barrier layer.

2. The structure according to claim 1, wherein the first layer includes a mixed layer containing the selected element and an element contained in the semiconductor layer.

3. The structure according to claim 1, comprising an Mg layer interposed between the tunnel barrier layer and the magnetic layer.

4. The structure according to claim 1, wherein the magnetic layer includes a first magnetic film, a second magnetic film, and a nonmagnetic film interposed between the first magnetic film and the second magnetic film.

5. The structure according to claim 4, wherein magnetization directions of the first and second magnetic films are perpendicular to each other, the magnetization direction of one of the first and second magnetic films being perpendicular to a film plane.

6. The structure according to claim 1, wherein the tunnel barrier layer is one of an MgO layer and an $MgAl_2O_3$ layer.

7. The structure according to claim 1, wherein the semiconductor layer is one of a Si layer, a Ge layer, a SiGe layer, and an InGaAs layer.

8. A spin transistor comprising:
a semiconductor layer;
a source region and a drain region formed at a distance from each other on the semiconductor layer;
a gate insulating film formed on a portion of the semiconductor layer, the portion being located between the source region and the drain region;
a gate electrode formed on the gate insulating film;
a first stacked structure formed on the source region, the first stacked structure including: a first layer formed on the source region, the first layer containing at least one element selected from Zr, Ti, and Hf, the first layer being not less than 1 atomic layer and not more than 5 atomic layers; a first tunnel barrier layer formed on the first layer; and a first magnetic layer formed on the first tunnel barrier layer; and
a second stacked structure formed on the drain region, the second stacked structure including: a second layer formed on the drain region, the second layer containing at least one element selected from Zr, Ti, and Hf, the second layer being not less than 1 atomic layer and not more than 5 atomic layers; a second tunnel barrier layer formed on the second layer; and a second magnetic layer formed on the second tunnel barrier layer.

9. The transistor according to claim 8, wherein the first and second layers each include a mixed layer containing the selected element and an element contained in the semiconductor layer.

10. The transistor according to claim 8, wherein
the first stacked structure further includes a first Mg layer interposed between the first tunnel barrier layer and the first magnetic layer, and
the second stacked structure further includes a second Mg layer interposed between the second tunnel barrier layer and the second magnetic layer.

11. The transistor according to claim 8, wherein at least one of the first and second magnetic layers includes a first magnetic film, a second magnetic film, and a nonmagnetic film interposed between the first magnetic film and the second magnetic film.

12. The transistor according to claim 11, wherein magnetization directions of the first and second magnetic films are perpendicular to each other, the magnetization direction of one of the first and second magnetic films being perpendicular to a film plane.

13. The transistor according to claim 8, wherein each of the first and second tunnel barrier layers is one of an MgO layer and an $MgAl_2O_3$ layer.

14. The transistor according to claim 8, wherein the semiconductor layer is one of a Si layer, a Ge layer, a SiGe layer, and an InGaAs layer.

15. The transistor according to claim 8, wherein a width of the portion of the semiconductor layer located between the source region and the drain region is smaller than a width of either of the source region and the drain region in a direction perpendicular to a direction from the source region toward the drain region.

16. A reconfigurable logic circuit having a look-up table circuit including a memory, the reconfigurable logic circuit comprising
the spin transistor of claim 8 as the memory.

* * * * *